United States Patent
Kim et al.

(10) Patent No.: US 10,431,511 B2
(45) Date of Patent: Oct. 1, 2019

(54) POWER AMPLIFIER WITH RF STRUCTURE

(71) Applicant: QUALCOMM Incorporated, San Diego, CA (US)

(72) Inventors: Daeik Daniel Kim, Del Mar, CA (US);
Shu Zhang, San Diego, CA (US);
Bonhoon Koo, San Diego, CA (US);
Manuel Aldrete, Encinitas, CA (US);
Jie Fu, San Diego, CA (US);
Chin-Kwan Kim, San Diego, CA (US);
Babak Nejati, San Diego, CA (US);
Husnu Ahmet Masaracioglu, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/584,000

(22) Filed: May 1, 2017

(65) Prior Publication Data
US 2018/0316319 A1  Nov. 1, 2018

(51) Int. Cl.
*H01L 23/12* (2006.01)
*H01L 23/66* (2006.01)
*H01L 23/498* (2006.01)
*H01L 23/552* (2006.01)

(52) U.S. Cl.
CPC ........ *H01L 23/12* (2013.01); *H01L 23/49816* (2013.01); *H01L 23/49827* (2013.01); *H01L 23/49838* (2013.01); *H01L 23/552* (2013.01); *H01L 23/66* (2013.01); H01L 2223/6616 (2013.01); H01L 2223/6655 (2013.01); H01L 2223/6677 (2013.01); H01L 2224/16237 (2013.01); H01L 2224/48106 (2013.01); H01L 2224/48228 (2013.01); H01L 2224/48235 (2013.01); H01L 2224/49175 (2013.01)

(58) Field of Classification Search
CPC . H01L 23/66; H01L 24/06; H01L 2223/6616; H01L 2223/6655; H01L 2223/6677; H01L 2224/02371; H01L 2224/02381; H01L 2224/387; H03F 1/565; H03F 3/189; H03F 3/20; H03F 2200/387; H03F 200/451
USPC .......................................................... 333/12
See application file for complete search history.

(56) References Cited

U.S. PATENT DOCUMENTS

| | | | |
|---|---|---|---|
| 7,260,890 B2 | 8/2007 | White et al. | |
| 8,253,486 B2 | 8/2012 | Kim et al. | |
| 8,451,581 B2 | 5/2013 | Chandrasekaran et al. | |
| 9,548,267 B2 | 1/2017 | Tsai et al. | |
| 2007/0257339 A1 | 11/2007 | Chen et al. | |
| 2017/0194088 A1* | 7/2017 | Massolini | H01F 27/2804 |
| 2018/0197668 A1* | 7/2018 | Kim | H01F 27/292 |

* cited by examiner

*Primary Examiner* — Robert J Pascal
*Assistant Examiner* — Kimberly E Glenn
(74) *Attorney, Agent, or Firm* — Muncy, Geissler, Olds & Lowe, P.C./Qualcomm

(57) ABSTRACT

In exemplary aspects of the disclosure, magnetic coupling problems in a power amplifier/antenna circuit may be address by using a self-shielded RF inductor mounted over the PA output match inductor embedded in the substrate to offer full RF isolation of both PA output match inductors (self-shielded and embedded) or using a self-shielded RF inductor mounted over the PA output match inductor embedded in the substrate along with a component level conformal shield around the self-shielded inductor on the assembly structure.

31 Claims, 7 Drawing Sheets

POWER AMPLIFIER WITH RF STRUCTURE

FIELD OF DISCLOSURE

This disclosure relates generally to power amplifiers, and more specifically, but not exclusively, shielded power amplifiers

BACKGROUND

In mobile phone applications, for example, an antenna may be coupled to a power amplifier (PA) to drive the antenna circuit. To drive the antenna circuit effectively, the output of the PA should be impedance matched to the antenna circuit. One method involves the use of inductors for impedance matching of the output. However, a PA output match inductor forms a strong magnetic field that couples to adjacent devices, such as surface mount device (SMD) parts and duplexers. This magnetic coupling contaminates receive (RX) and transmit (TX) signals from antennas driven by the PA, which worsens the sensitivity of the PA/antenna combination and noise figure for the amplifier/antenna circuit. If a conformal shield is used to shield the entire device—PA, antenna, SMDs, substrate, etc. (module level conformal shield)—the coupling becomes worse since the magnetic waves will bounce around inside the module and the shield itself will work as an antenna.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a shield structure comprises: a first substrate; a second substrate located above the first substrate; a power amplifier on the first substrate and configured to output a drive current; a first inductor embedded in the first substrate and coupled to the power amplifier; a second inductor embedded in the second substrate and coupled to the first inductor, the first inductor and the second inductor configured to match an impedance of the drive current; and a ground wall surrounding the first inductor and the second inductor, the ground wall configured to isolate a magnetic field produced by the first inductor and the second inductor.

In another aspect, a shield structure, comprises: a first substrate; a second substrate located above the first substrate; a power amplifier on the first substrate and configured to output a drive current; a first inductor embedded in the first substrate and coupled to the power amplifier; a second inductor embedded in the second substrate and coupled to the first inductor, the first inductor and the second inductor configured to match an impedance of the drive current; a ground wall surrounding the first inductor and the second inductor, the ground wall configured to isolate a magnetic field produced by the first inductor and the second inductor; and a shield surrounding the second substrate and coupled to the ground wall.

In still another aspect, a shield structure, comprises: a first substrate; a second substrate located above the first substrate; a power amplifier on the first substrate and configured to output a drive current; a first inductor embedded in the first substrate and coupled to the power amplifier; a second inductor embedded in the second substrate and coupled to the first inductor, the first inductor and the second inductor configured to match an impedance of the drive current; and first means for shielding a magnetic field, the first means for shielding the magnetic field surrounding the first inductor and the second inductor, the first means for shielding the magnetic field configured to isolate a magnetic field produced by the first inductor and the second inductor.

In still another aspect, a shield structure, comprises: a first substrate; a second substrate located above the first substrate; a power amplifier on the first substrate and configured to output a drive current; a first inductor embedded in the first substrate and coupled to the power amplifier; a second inductor embedded in the second substrate and coupled to the first inductor, the first inductor and the second inductor configured to match an impedance of the drive current; first means for shielding a magnetic field surrounding the first inductor and the second inductor, the first means for shielding the magnetic field configured to isolate a magnetic field produced by the first inductor and the second inductor; and second means for shielding the magnetic field surrounding the second substrate and coupled to the first means for shielding the magnetic field.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
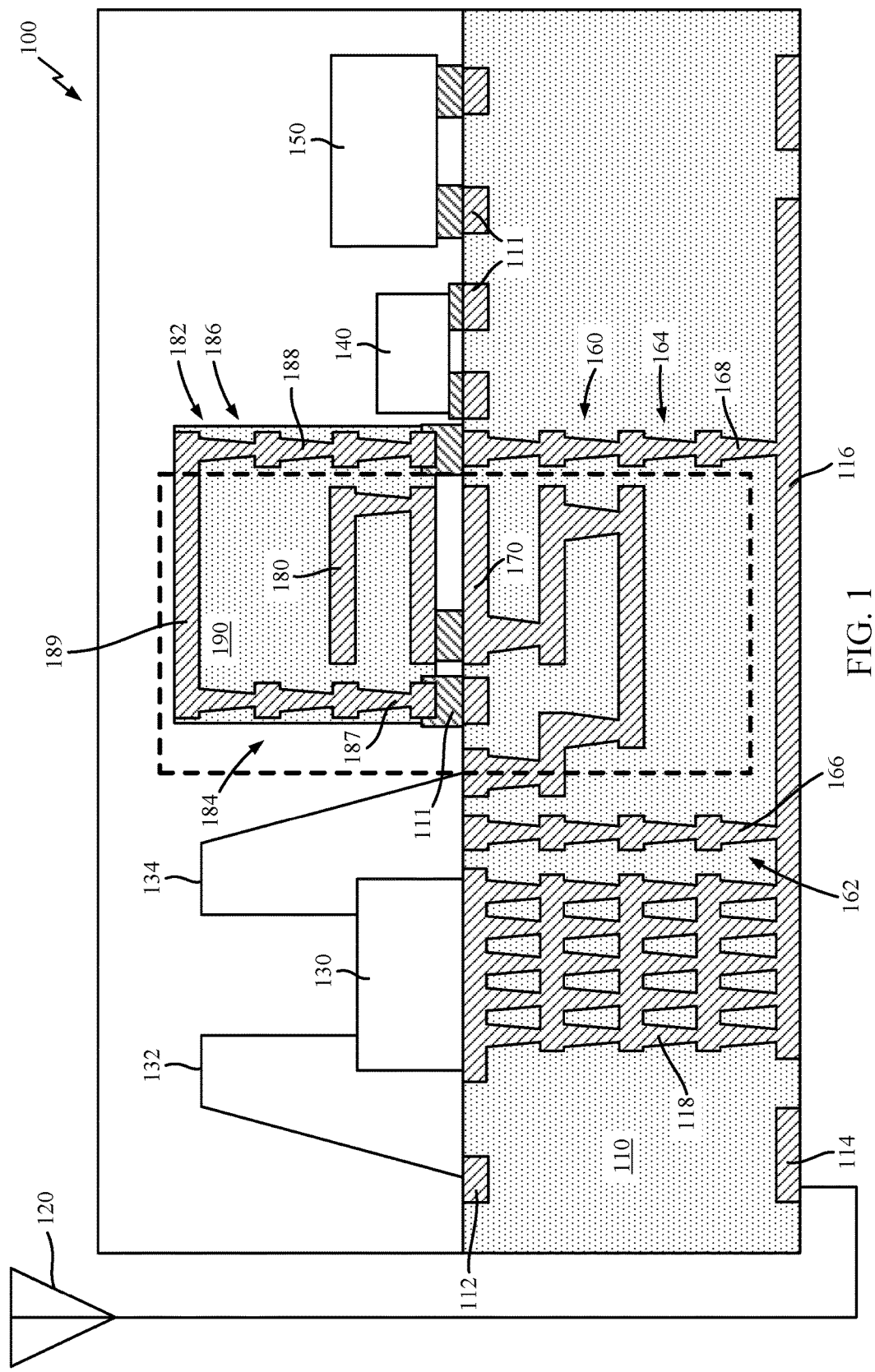
FIG. 1 illustrates a partial side view of an exemplary PA with a shield structure in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, to address the magnetic coupling problem in a power amplifier/antenna circuit, one of two approaches may be used—(1) using a self-shielded radio frequency (RF) inductor(s) mounted over the PA output match inductor embedded in the substrate (load-line area) to offer full RF isolation of both PA output match inductors (self-shielded and embedded), self-shielding may be done with laminate substrate structure (via and ground plate coupled to substrate ground/ground wall) to prevent the magnetic field produced by the inductors from leaking to nearby components, circuits, or traces; and (2) using a self-shielded RF inductor(s) mounted over the PA output match inductor embedded in the substrate along with a component level conformal shielding around the self-shielded inductor on the assembly structure, which also prevents the magnetic field produced by the inductors from leaking to nearby components, circuits, or traces. Such exemplary aspects may enable self-shielding of output match inductors, completely shield high-power emitting inductive devices from other components, improve low noise amplifier noise figure and PA desense, improve load-line inductor Q-factor, enables quick loadline tuning through assembly and reduces module variants, avoid affecting inductance by whole module shielding, possible grounding with whole module shielding, and provide a way to implement inductive coupling between first and second output match inductors as well as prevent contamination of receive (RX) and transmit (TX) signals from antennas driven by the PA and leakage of the magnetic field produced by the inductors.

FIG. 1 illustrates a partial side view of an exemplary PA with a shield structure in accordance with some examples of the disclosure. As shown in FIG. 1, a shield structure 100 may include a first substrate 110 (e.g. coreless, organic, silicon, silicon dioxide, aluminum oxide, sapphire, germanium, gallium arsenide, an alloy of silicon and germanium, or indium phosphide), an antenna 120 connected to the first substrate 110 (e.g. through a port in a second (RDL) 114), a PA 130 mounted on the first substrate 110 and directly connected to the first RDL 112, a SMD 140 (e.g. an inductor or capacitor) mounted on the first substrate 110 and connected to the first RDL 112 through one or more solder balls 111, and a duplexer 150 mounted on the first substrate 110 and connected to the first RDL 112 through one or more solder balls 111. The first substrate 110 may include a second RDL 114 embedded in the first substrate 112 opposite the first RDL 112, a first ground 116 embedded in the first substrate 112 proximate the second RDL 114, a first plurality of vias 118 configured to connect the PA 130 to the first ground 116, a first ground wall 160 connected to the first ground 116, and a first inductor 170 partially surrounded by the first ground wall 160 and connected to the PA 130 through the first RDL 112. The first ground wall 160 may include a first portion 162 extending from first RDL 112 to the first ground 116 and a second portion 164 extending from the first RDL 112 to the first ground 116 on an opposite side of the first inductor 170 from the first portion 162. The first portion 162 and the second portion 164 of the first ground wall 160 may be comprised of a second plurality of vias 166 and a third plurality of vias 168, respectively. The PA 130 may include a first lead 132 coupling the PA 130 to the first RDL 112 and the antenna 120 and a second lead 134 coupling the PA 130 to the first inductor 170 and the second inductor 180 through the first RDL 112 to impedance match the PA output to effectively drive the antenna 120.

The shield structure 100 may include a second substrate 190 (e.g. coreless, organic, silicon, silicon dioxide, aluminum oxide, sapphire, germanium, gallium arsenide, an alloy of silicon and germanium, or indium phosphide) mounted above the first substrate 110. The second substrate 190 may include a second ground 189 embedded in the second substrate 190 opposite the first substrate 110, a second ground wall 182 connected to the second ground 189 and a second inductor 180 partially surrounded by the second ground wall 182 and connected to the first ground wall 160 through one or more solder balls 111 and/or the first RDL 112. The second ground wall 182 may include a first portion 184 extending from second ground 189 to a solder ball 111 and a second portion 186 extending from the second ground 189 to the first ground 116 through a solder ball 111. The first portion 184 and the second portion 186 of the second ground wall 182 may be comprised of a fourth plurality of vias 187 and a fifth plurality of vias 188, respectively. The second inductor 180 may be connected to the first inductor 170 by one or more solder balls 111. The first ground wall 160 and the second ground wall 182 may be configured to surround the first inductor 170 and the second inductor 180 to shield magnetic fields from the shield structure 100 including, for example, the antenna 120, the PA 130, the SMD 140, and the duplexer 150. Thus, the first ground wall 160 and the second ground wall 182 isolate and prevent the magnetic field produced by the first inductor 170 and the second inductor 180 from leaking that would affect nearby components, circuits, traces, or contaminating the receive or transmit signals from the antenna 120. The magnetic field produced by the first inductor 170 and the second inductor 180 will interact with or be absorbed by the first ground wall 160 and the second ground wall 182 without propagating outside the first ground wall 160 and the second ground wall 182 and interfering with other components.

Figure 2:
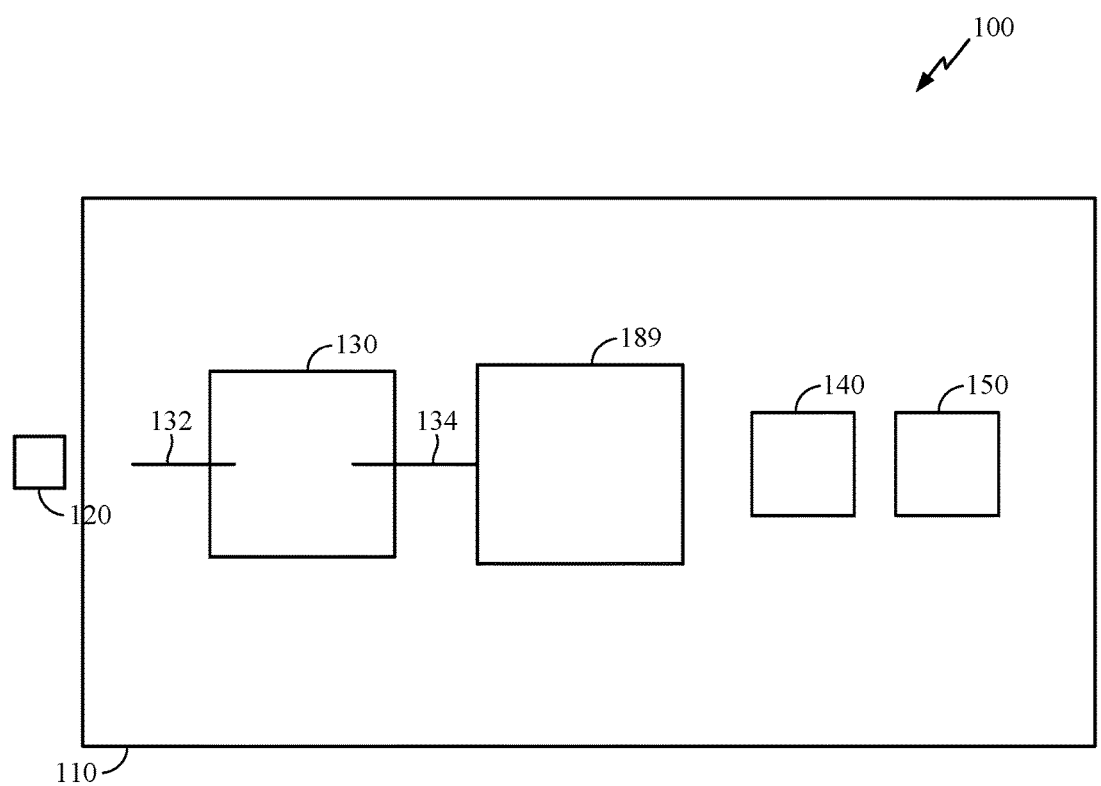
FIG. 2 illustrates a partial top view of an exemplary PA with a shield structure in accordance with some examples of the disclosure.

FIG. 2 illustrates a partial top view of an exemplary PA with a shielding structure in accordance with some examples of the disclosure. As shown in FIG. 2, the shield structure 100 may include a first substrate 110, an antenna 120 coupled to the first substrate 110, a PA 130 mounted on the first substrate 110, a first lead 132 coupling the PA 130 to the first substrate 110, a second lead 134 coupling the PA 130 to the first substrate 110, a second ground 189 located above the first substrate 110, a SMD 140 mounted on the first substrate 110, and a duplexer 150 mounted on the first substrate 110.

Figure 3:
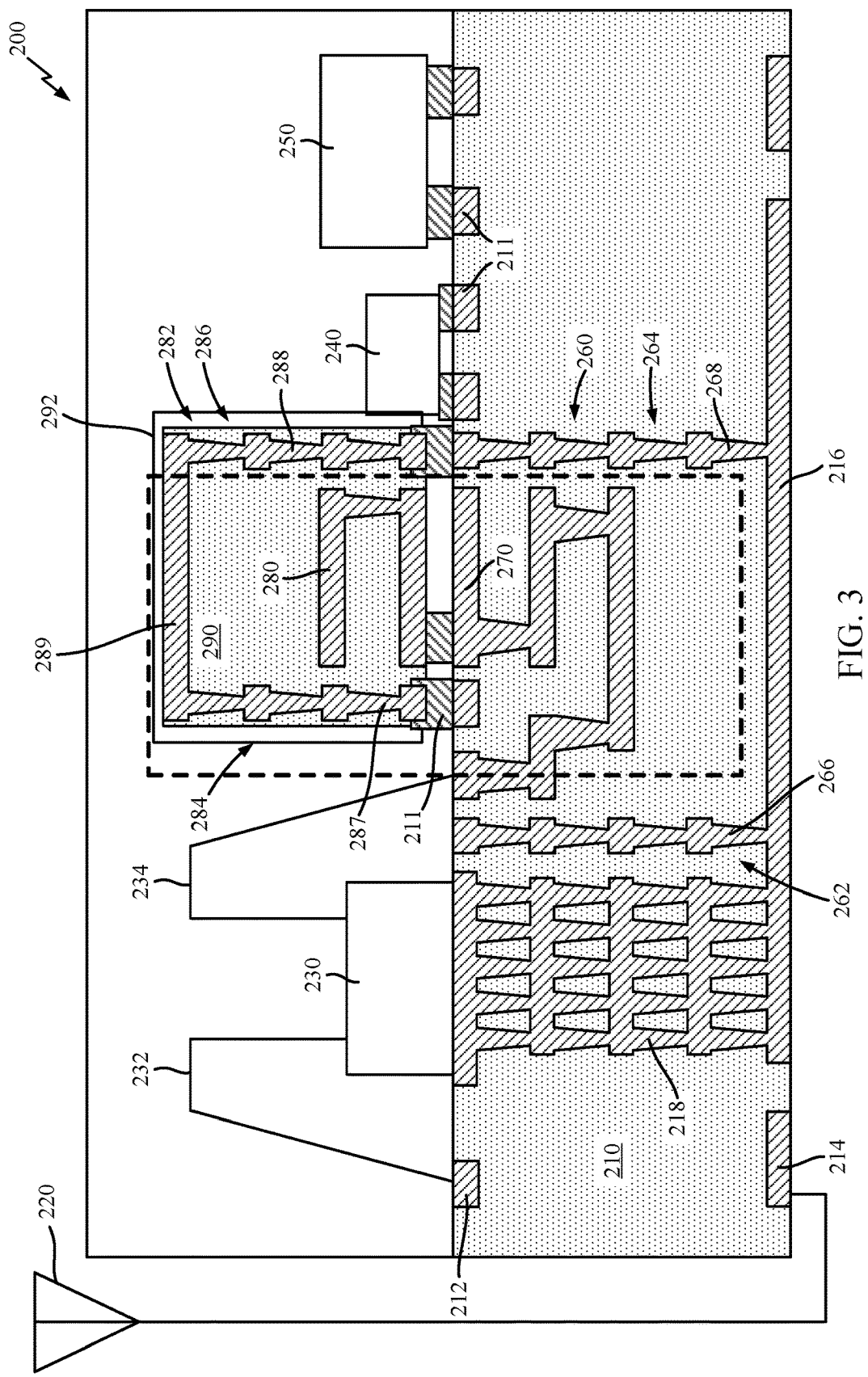
FIG. 3 illustrates a partial side view of an exemplary PA with a conformal shield structure in accordance with some examples of the disclosure.

FIG. 3 illustrates a partial side view of an exemplary PA with a conformal shield structure in accordance with some examples of the disclosure. As shown in FIG. 3, a shield structure 200 may include a first substrate 210 (e.g. coreless, organic, silicon, silicon dioxide, aluminum oxide, sapphire, germanium, gallium arsenide, an alloy of silicon and germanium, or indium phosphide), an antenna 220 connected to the first substrate 210 (e.g. through a port in a second (RDL) 214), a PA 230 mounted on the first substrate 210 and directly connected to the first RDL 212, a SMD 240 (e.g. an inductor or capacitor) mounted on the first substrate 210 and connected to the first RDL 212 through one or more solder balls 211, and a duplexer 250 mounted on the first substrate 210 and connected to the first RDL 212 through one or more solder balls 211. The first substrate 210 may include a second RDL 214 embedded in the first substrate 212 opposite the first RDL 212, a first ground 216 embedded in the first substrate 212 proximate the second RDL 214, a first plurality of vias 218 configured to connect the PA 230 to the first ground 216, a first ground wall 260 connected to the first ground 216, and a first inductor 270 partially surrounded by the first ground wall 260 and connected to the PA 230 through the first RDL 212. The first ground wall 260 may include a first portion 262 extending from first RDL 212 to the first ground 216 and a second portion 264 extending from the first RDL 212 to the first ground 216 on an opposite side of the first inductor 270 from the first portion 262. The first portion 262 and the second portion 264 of the first ground wall 260 may be comprised of a second plurality of vias 266 and a third plurality of vias 268, respectively. The PA 230 may include a first lead 232 coupling the PA 230 to the first RDL 212 and the antenna 220 and a second lead 234 coupling the PA 230 to the first inductor 270 and the second inductor 280 through the first RDL 212 to impedance match the PA output to effectively drive the antenna 220.

The shield structure 200 may include a second substrate 290 (e.g. coreless, organic, silicon, silicon dioxide, aluminum oxide, sapphire, germanium, gallium arsenide, an alloy of silicon and germanium, or indium phosphide) mounted above the first substrate 210. The second substrate 290 may include a second ground 289 embedded in the second substrate 290 opposite the first substrate 210, a second ground wall 282 connected to the second ground 289 and a second inductor 280 partially surrounded by the second ground wall 282 and connected to the first ground wall 260 through one or more solder balls 211 and/or the first RDL 212. The second ground wall 282 may include a first portion 284 extending from second ground 289 to a solder ball 211 and a second portion 286 extending from the second ground 289 to the first ground 216 through a solder ball 211. The first portion 284 and the second portion 286 of the second ground wall 282 may be comprised of a fourth plurality of vias 287 and a fifth plurality of vias 288, respectively. The second inductor 280 may be connected to the first inductor 270 by one or more solder balls 211. The first ground wall 260 and the second ground wall 282 may be configured to surround the first inductor 270 and the second inductor 280 to shield magnetic fields from the shield structure 200 including, for example, the antenna 220, the PA 230, the SMD 240, and the duplexer 250. The shield structure may include a shield 292 that partially surrounds the second substrate 290 conforming to the contours of the second substrate 290 and connected to one or more of the first portion 284 of the second ground wall 282, the second portion 286 of the second ground wall 282, and the second ground 289. Thus, the shield 292, the first ground wall 260, and the second ground wall 282 isolate and prevent the magnetic field produced by the first inductor 270 and the second inductor 280 from leaking that would affect nearby components, circuits, traces, or contaminating the receive or transmit signals from the antenna 220. The magnetic field produced by the first inductor 270 and the second inductor 280 will interact with or be absorbed by the shield 292, the first ground wall 260, and the second ground wall 282 without propagating outside the shield 292, the first ground wall 260, and the second ground wall 282 and interfering with other components.

Figure 4:
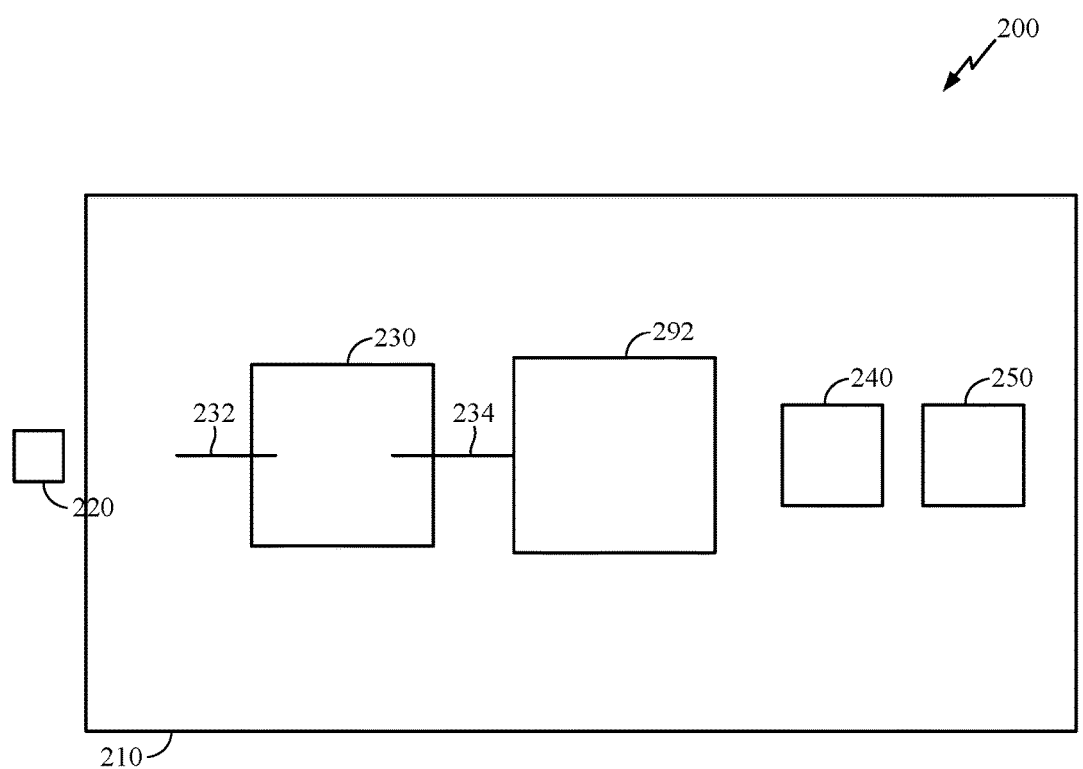
FIG. 4 illustrates a partial top view of an exemplary PA with a conformal shield structure in accordance with some examples of the disclosure.

FIG. 4 illustrates a partial top view of an exemplary PA with a conformal shield structure in accordance with some examples of the disclosure. As shown in FIG. 4, the shield structure 200 may include a first substrate 210, an antenna 220 coupled to the first substrate 210, a PA 230 mounted on the first substrate 210, a first lead 232 coupling the PA 230 to the first substrate 210, a second lead 234 coupling the PA 230 to the first substrate 210, a shield 292 located above the first substrate 210, a SMD 240 mounted on the first substrate 210, and a duplexer 250 mounted on the first substrate 210.

Figure 5:
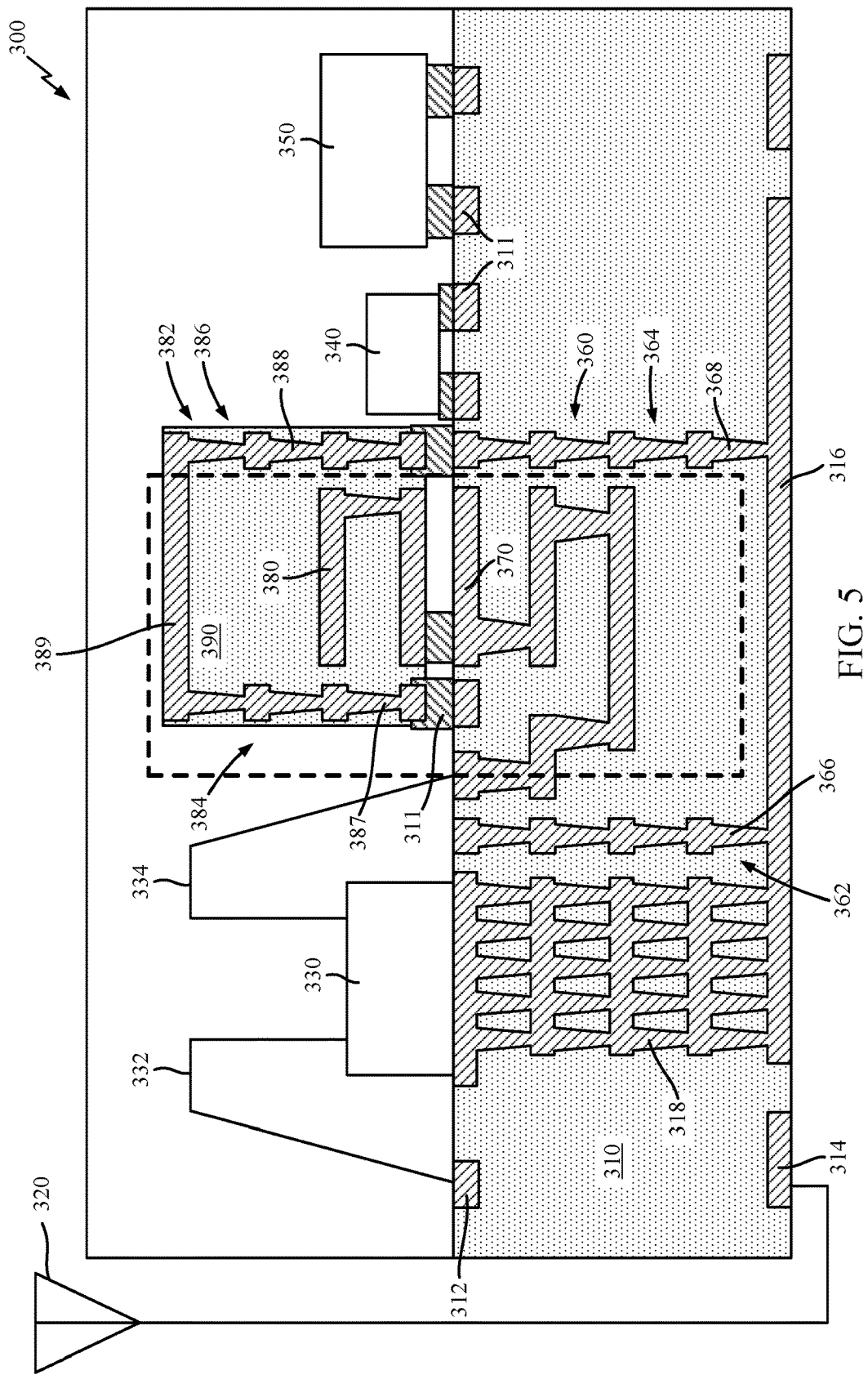
FIG. 5 illustrates a partial side view of an exemplary PA with a shielding structure in accordance with some examples of the disclosure.

FIG. 5 illustrates a partial side view of an exemplary PA with a shield structure in accordance with some examples of the disclosure. As shown in FIG. 5, a shield structure 300 may include a first substrate 310, an antenna 320 connected to the first substrate 310 (e.g. through a port in a second (RDL) 314), a PA 330 mounted on the first substrate 310 and directly connected to the first RDL 312, a SMD 340 (e.g. an inductor or capacitor) mounted on the first substrate 310 and connected to the first RDL 312 through one or more solder balls 311, and a duplexer 350 mounted on the first substrate 310 and connected to the first RDL 312 through one or more solder balls 311. The first substrate 310 may include a second RDL 314 embedded in the first substrate 312 opposite the first RDL 312, a first ground 316 embedded in the first substrate 312 proximate the second RDL 314, a first plurality of vias 318 configured to connect the PA 330 to the first ground 316, a first means for shielding a magnetic field 360 (e.g. first ground wall 160 or first ground wall 260) connected to the first ground 316, and a first inductor 370 partially surrounded by the first means for shielding a magnetic field 360 and connected to the PA 330 through the first RDL 312. The first means for shielding a magnetic field 360 may include a first portion 362 extending from first RDL 312 to the first ground 316 and a second portion 364 extending from the first RDL 312 to the first ground 316 on an opposite side of the first inductor 370 from the first portion 362. The first portion 362 and the second portion 364 of the first means for shielding a magnetic field 360 may be comprised of a second plurality of vias 366 and a third plurality of vias 368, respectively. The PA 330 may include a first lead 332 coupling the PA 330 to the first RDL 312 and the antenna 320 and a second lead 334 coupling the PA 330 to the first inductor 370 and the second inductor 380 through the first RDL 312 to impedance match the PA output to effectively drive the antenna 320.

The shield structure 300 may include a second substrate 390 mounted above the first substrate 310. The second substrate 390 may include a second ground 389 embedded in the second substrate 390 opposite the first substrate 310, a second means for shielding a magnetic field 382 (e.g. second ground wall 182 or first ground wall 282) connected to the second ground 389 and a second inductor 380 partially surrounded by the second means for shielding a magnetic field 382 and connected to the first means for shielding a magnetic field 360 through one or more solder balls 311 and/or the first RDL 312. The second means for shielding a magnetic field 382 may include a first portion 384 extending from second ground 389 to a solder ball 311 and a second portion 386 extending from the second ground 389 to the first ground 316 through a solder ball 311. The first portion 384 and the second portion 386 of the second means for shielding a magnetic field 382 may be comprised of a fourth plurality of vias 387 and a fifth plurality of vias 388, respectively. The second inductor 380 may be connected to the first inductor 370 by one or more solder balls 311. The first means for shielding a magnetic field 360 and the second means for shielding a magnetic field 382 may be configured to surround the first inductor 370 and the second inductor 380 to shield magnetic fields from the shield structure 300 including, for example, the antenna 320, the PA 330, the SMD 340, and the duplexer 350. Thus, the first means for shielding a magnetic field 360 and the second means for shielding a magnetic field 382 isolate and prevent the magnetic field produced by the first inductor 370 and the second inductor 380 from leaking that would affect nearby components, circuits, traces, or contaminating the receive or transmit signals from the antenna 320. The magnetic field produced by the first inductor 370 and the second inductor 380 will interact with or be absorbed by the first means for shielding a magnetic field 360 and the second means for shielding a magnetic field 382 without propagating outside the first means for shielding a magnetic field 360 and the second means for shielding a magnetic field 382 and interfering with other components.

Figure 6:
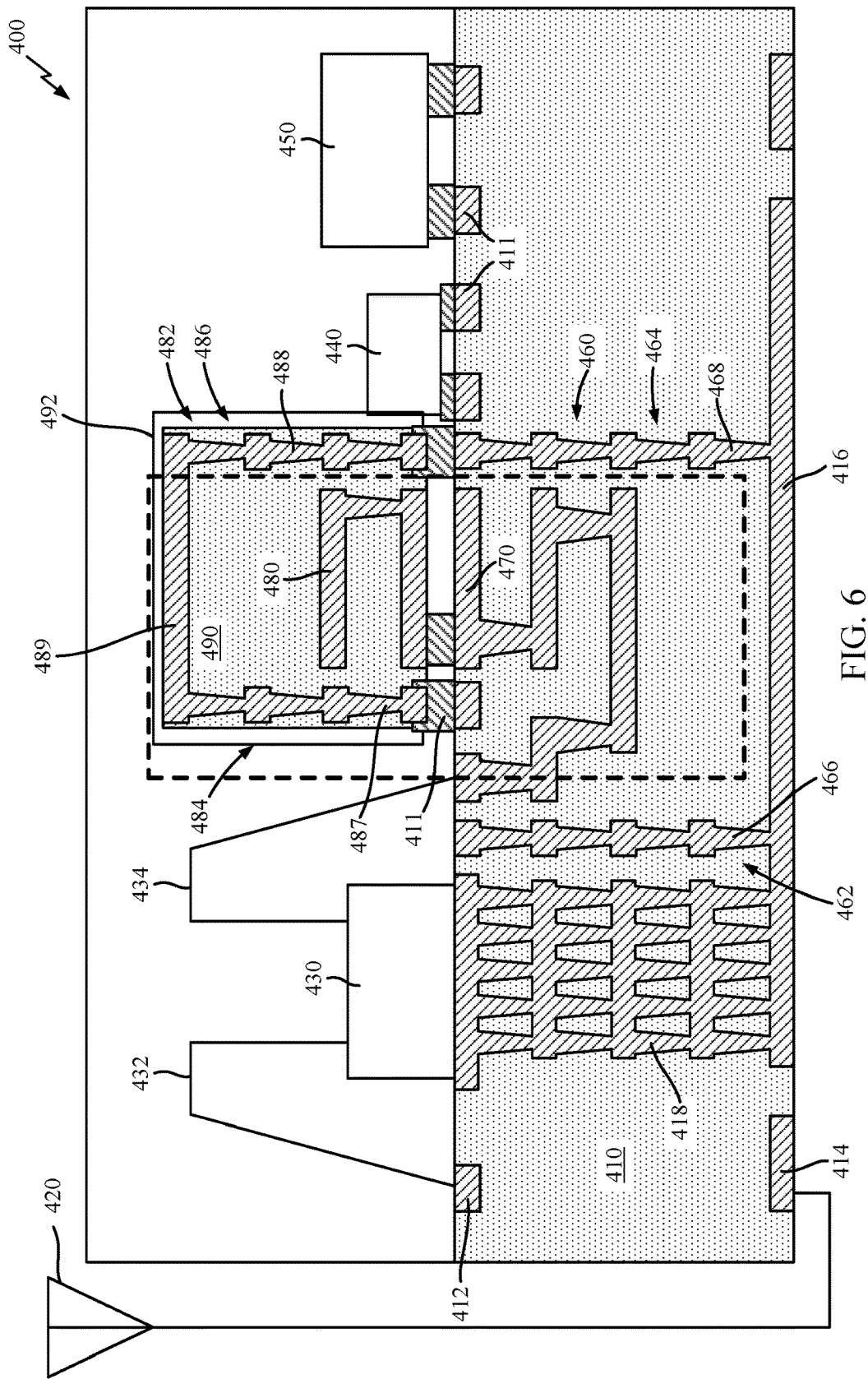
FIG. 6 illustrates a partial side view of an exemplary PA with a conformal shielding structure in accordance with some examples of the disclosure.

FIG. 6 illustrates a partial side view of an exemplary PA with a conformal shield structure in accordance with some examples of the disclosure. As shown in FIG. 6, a shield structure 400 may include a first substrate 410, an antenna 420 connected to the first substrate 410 (e.g. through a port in a second (RDL) 414), a PA 430 mounted on the first substrate 410 and directly connected to the first RDL 412, a SMD 440 (e.g. an inductor or capacitor) mounted on the first substrate 410 and connected to the first RDL 412 through one or more solder balls 411, and a duplexer 450 mounted on the first substrate 410 and connected to the first RDL 412 through one or more solder balls 411. The first substrate 410 may include a second RDL 414 embedded in the first substrate 412 opposite the first RDL 412, a first ground 416 embedded in the first substrate 412 proximate the second RDL 414, a first plurality of vias 418 configured to connect the PA 430 to the first ground 416, a first means for shielding a magnetic field 460 (e.g. first ground wall 160 or first ground wall 260) connected to the first ground 416, and a first inductor 470 partially surrounded by the first means for shielding a magnetic field 460 and connected to the PA 430 through the first RDL 412. The first means for shielding a magnetic field 460 may include a first portion 462 extending from first RDL 412 to the first ground 416 and a second portion 464 extending from the first RDL 412 to the first ground 416 on an opposite side of the first inductor 470 from the first portion 462. The first portion 462 and the second portion 464 of the first means for shielding a magnetic field 460 may be comprised of a second plurality of vias 466 and a third plurality of vias 468, respectively. The PA 430 may include a first lead 432 coupling the PA 430 to the first RDL 412 and the antenna 420 and a second lead 434 coupling the PA 430 to the first inductor 470 and the second inductor 480 through the first RDL 412 to impedance match the PA output to effectively drive the antenna 420.

The shield structure 400 may include a second substrate 490 mounted above the first substrate 410. The second substrate 490 may include a second ground 489 embedded in the second substrate 490 opposite the first substrate 410, a second means for shielding a magnetic field 482 (e.g. second ground wall 182 or second ground wall 282) connected to the second ground 489 and a second inductor 480 partially surrounded by the second means for shielding a magnetic field 482 and connected to the first means for shielding a magnetic field 460 through one or more solder balls 411 and/or the first RDL 412. The second means for shielding a magnetic field 482 may include a first portion 484 extending from second ground 489 to a solder ball 411 and a second portion 486 extending from the second ground 489 to the first ground 416 through a solder ball 411. The first portion 484 and the second portion 486 of the second means for shielding a magnetic field 482 may be comprised of a fourth plurality of vias 487 and a fifth plurality of vias 488, respectively. The second inductor 480 may be connected to the first inductor 470 by one or more solder balls 411. The first means for shielding a magnetic field 460 and the second means for shielding a magnetic field 482 may be configured to surround the first inductor 470 and the second inductor 480 to shield magnetic fields from the shield structure 400 including, for example, the antenna 420, the PA 430, the SMD 440, and the duplexer 450. The shield structure may include a third means for shielding a magnetic field 492 (e.g. shield 292) that partially surrounds the second substrate 490 conforming to the contours of the second substrate 490 and connected to one or more of the first portion 484 of the second means for shielding a magnetic field 482, the second portion 486 of the second means for shielding a magnetic field 482, and the second ground 489. Thus, the first means for shielding a magnetic field 460, the second means for shielding a magnetic field 482, and the third means for shielding a magnetic field 492 isolate and prevent the magnetic field produced by the first inductor 470 and the second inductor 480 from leaking that would affect nearby components, circuits, traces, or contaminating the receive or transmit signals from the antenna 420. The magnetic field produced by the first inductor 470 and the second inductor 480 will interact with or be absorbed by the third means for shielding a magnetic field 492, the first means for shielding a magnetic field 460, and the second means for shielding a magnetic field 482 without propagating outside the third means for shielding a magnetic field 492, the first means for shielding a magnetic field 460, and the second means for shielding a magnetic field 482 and interfering with other components.

Figure 7:
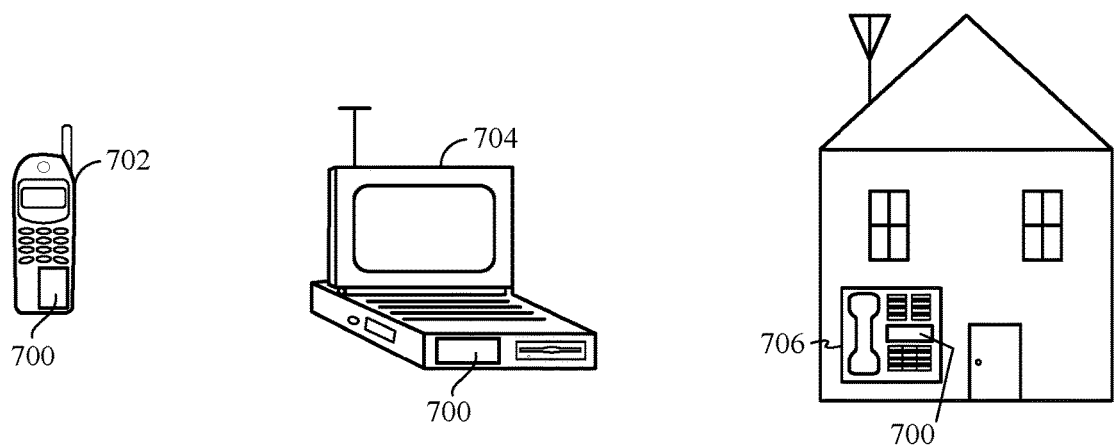
FIG. 7 illustrates various electronic devices that may be integrated with any of the aforementioned integrated device, semiconductor device, integrated circuit, die, interposer, package or package-on-package (PoP) in accordance with some examples of the disclosure.

FIG. 7 illustrates various electronic devices that may be integrated with any of the aforementioned integrated device, semiconductor device, integrated circuit, die, interposer, package or package-on-package (PoP) in accordance with some examples of the disclosure. For example, a mobile phone device 702, a laptop computer device 704, and a fixed location terminal device 706 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A shield structure, comprising:
a first substrate;
a second substrate located above the first substrate;
a power amplifier on the first substrate and configured to output a drive current;
a first inductor embedded in the first substrate and coupled to the power amplifier;
a second inductor embedded in the second substrate and coupled to the first inductor, the first inductor and the second inductor configured to match an impedance of the power amplifier; and
a ground wall surrounding the first inductor and the second inductor, the ground wall configured to isolate a magnetic field produced by the first inductor and the second inductor.

2. The shield structure of claim 1, further comprising:
a first ground embedded in the first substrate and coupled to the ground wall; and
wherein the ground wall comprises a first ground wall that partially encloses the first inductor,
the first ground wall coupled to the first ground, and a second ground wall that partially encloses the second inductor, the second ground wall coupled to the first ground wall.

3. The shield structure of claim 2, further comprising a second ground embedded in the second substrate and directly coupled to the second ground wall.

4. The shield structure of claim 2, wherein the first ground wall comprises a first plurality of vias extending from a redistribution layer embedded in the first substrate to the first ground and a second plurality of vias extending from the first ground to the second ground wall.

5. The shield structure of claim 4, wherein the second ground wall comprises a third plurality of vias extending from the redistribution layer to the second ground and a fourth plurality of vias extending from the second ground to the second plurality of vias.

6. The shield structure of claim 1, further comprising an antenna coupled to the power amplifier and configured to be driven by the drive current to transmit and receive signals.

7. The shield structure of claim 6, further comprising a surface mounted device mounted on the first substrate and connected to a first redistribution layer.

8. The shield structure of claim 1, wherein shield structure is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

9. A shield structure, comprising:
a first substrate;
a second substrate located above the first substrate;
a power amplifier on the first substrate and configured to output a drive current;
a first inductor embedded in the first substrate and coupled to the power amplifier;
a second inductor embedded in the second substrate and coupled to the first inductor, the first inductor and the second inductor configured to match an impedance of the power amplifier;
a ground wall surrounding the first inductor and the second inductor, the ground wall configured to isolate a magnetic field produced by the first inductor and the second inductor; and
a shield surrounding the second substrate and coupled to the ground wall.

10. The shield structure of claim 9, further comprising:
a first ground embedded in the first substrate and coupled to the ground wall; and
wherein the ground wall comprises a first ground wall that partially encloses the first inductor,
the first ground wall coupled to the first ground, and a second ground wall that partially encloses the second inductor, the second ground wall coupled to the first ground wall.

11. The shield structure of claim 10, further comprising a second ground embedded in the second substrate and directly coupled to the second ground wall.

12. The shield structure of claim 10, wherein the first ground wall comprises a first plurality of vias extending from a redistribution layer embedded in the first substrate to the first ground and a second plurality of vias extending from the first ground to the second ground wall.

13. The shield structure of claim 12, wherein the second ground wall comprises a third plurality of vias extending from the redistribution layer to the second ground and a fourth plurality of vias extending from the second ground to the second plurality of vias.

14. The shield structure of claim 9, further comprising an antenna coupled to the power amplifier and configured to be driven by the drive current to transmit and receive signals.

15. The shield structure of claim 14, further comprising a surface mounted device mounted on the first substrate and connected to a first redistribution layer.

16. The shield structure of claim 9, wherein shield structure is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. A shield structure, comprising:
a first substrate;
a second substrate located above the first substrate;
a power amplifier on the first substrate and configured to output a drive current;
a first inductor embedded in the first substrate and coupled to the power amplifier;
a second inductor embedded in the second substrate and coupled to the first inductor, the first inductor and the second inductor configured to match an impedance of the power amplifier; and
first means for shielding a magnetic field, the first means for shielding the magnetic field surrounding the first inductor and the second inductor, the first means for shielding the magnetic field configured to isolate a magnetic field produced by the first inductor and the second inductor from leakage.

18. The shield structure of claim 17, further comprising:
a first ground embedded in the first substrate and coupled to the first means for shielding the magnetic field; and wherein the first means for shielding the magnetic field comprises a first ground wall that partially encloses the first inductor, the first ground wall coupled to the first ground, and a second ground wall that partially encloses the second inductor, the second ground wall coupled to the first ground wall.

19. The shield structure of claim 18, further comprising a second ground embedded in the second substrate and directly coupled to the second ground wall.

20. The shield structure of claim 18, wherein the first ground wall comprises a first plurality of vias extending from a redistribution layer embedded in the first substrate to the first ground and a second plurality of vias extending from the first ground to the second ground wall.

21. The shield structure of claim 20, wherein the second ground wall comprises a third plurality of vias extending from the redistribution layer to the second ground and a fourth plurality of vias extending from the second ground to the second plurality of vias.

22. The shield structure of claim 17, further comprising an antenna coupled to the power amplifier and configured to be driven by the drive current to transmit and receive signals.

23. The shield structure of claim 22, further comprising a surface mounted device mounted on the first substrate and connected to a first redistribution layer.

24. The shield structure of claim 17, wherein shield structure is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

25. A shield structure, comprising:
a first substrate;
a second substrate located above the first substrate;
a power amplifier on the first substrate and configured to output a drive current;
a first inductor embedded in the first substrate and coupled to the power amplifier;
a second inductor embedded in the second substrate and coupled to the first inductor, the first inductor and the second inductor configured to match an impedance of the power amplifier;
first means for shielding a magnetic field surrounding the first inductor and the second inductor,
the first means for shielding the magnetic field configured to isolate a magnetic field produced by the first inductor and the second inductor from leakage; and
second means for shielding the magnetic field surrounding the second substrate and coupled to the first means for shielding the magnetic field.

26. The shield structure of claim 25, further comprising:
a first ground embedded in the first substrate and coupled to the first means for shielding the magnetic field; and
wherein the first means for shielding the magnetic field comprises a first ground wall that partially encloses the first inductor, the first ground wall coupled to the first ground, and a second ground wall that partially encloses the second inductor, the second ground wall coupled to the first ground wall.

27. The shield structure of claim 26, further comprising a second ground embedded in the second substrate and directly coupled to the second ground wall.

28. The shield structure of claim 26, wherein the first ground wall comprises a first plurality of vias extending from a redistribution layer embedded in the first substrate to the first ground and a second plurality of vias extending from the first ground to the second ground wall.

29. The shield structure of claim 28, wherein the second ground wall comprises a third plurality of vias extending from the redistribution layer to the second ground and a fourth plurality of vias extending from the second ground to the second plurality of vias.

30. The shield structure of claim 25, wherein shield structure is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

31. The shield structure of claim 25, further comprising a surface mounted device mounted on the first substrate and connected to a redistribution layer.

* * * * *